United States Patent [19]
Eglit

[11] Patent Number: 6,157,376
[45] Date of Patent: Dec. 5, 2000

[54] METHOD AND APPARATUS FOR GENERATING A TARGET CLOCK SIGNAL HAVING A FREQUENCY OF X/Y TIMES THE FREQUENCY OF A REFERENCE CLOCK SIGNAL

[75] Inventor: Alexander Julian Eglit, Half Moon Bay, Calif.

[73] Assignee: Genesis Microchip, Corp., Alviso, Calif.

[21] Appl. No.: 09/164,081

[22] Filed: Sep. 30, 1998

[51] Int. Cl.[7] ................................ G09G 5/00
[52] U.S. Cl. ............................ 345/213; 345/211
[58] Field of Search ....................... 345/211, 213, 345/212

[56] References Cited

U.S. PATENT DOCUMENTS

| | | | |
|---|---|---|---|
| 5,841,430 | 11/1998 | Kuriko | 345/213 |
| 5,861,879 | 1/1999 | Shimizu et al. | 345/213 |
| 5,940,061 | 8/1999 | Sato | 345/213 |
| 6,022,538 | 1/2000 | Eglit | 345/213 |

Primary Examiner—Richard A. Hjerpe
Assistant Examiner—Duc Dinh
Attorney, Agent, or Firm—Law Firm of Naren Thappeta

[57] ABSTRACT

A clock generator circuit which provides for short comparison cycles even if X and Y do not have a large common denominator when a target clock signal having a frequency of (X/Y) times the frequency of a reference clock signal is to be generated. The comparison cycle is shortened by using approximately X/L and Y/L as divisors, instead of X and Y. As X/L and/or Y/L may not equal integers, multiple divisors may be used in a weighted fashion such that the weighted averages equal X/L or Y/L as the case may be.

20 Claims, 6 Drawing Sheets

METHOD AND APPARATUS FOR GENERATING A TARGET CLOCK SIGNAL HAVING A FREQUENCY OF X/Y TIMES THE FREQUENCY OF A REFERENCE CLOCK SIGNAL

BACKGROUND OF THE INVENTION

1. Field of the Invention

The present invention relates to computer graphics systems, and more specifically to a method and apparatus for generating a target clock signal having a frequency of X/Y times the frequency of a reference clock signal, wherein X and Y are integers.

2. Related Art

There is often a need to generate a clock signal ("target clock signal") which is synchronized with a reference clock signal. The two clock signals generally have unequal frequencies. For the purpose of illustration, the target clock signal may need to have a frequency of X/Y times the frequency of the reference clock signal, wherein X and Y are integers.

U.S. Pat. No. 5,739,867 ("867 patent") entitled, "A Method and Apparatus for Upscaling an Image in Both Vertical and Horizontal Directions", Issued Apr. 14, 1998, naming as inventor Alexander Julian Eglit, discloses an example situation in which. such a need arises. The patent discloses a scaling circuit which scales a source image of A×B pixels into a destination image of C×D pixels without requiring large memories.

The scaling circuit there scales the image by using a destination clock signal having ((C*D)/(A*B)) times the frequency of a source clock. The source clock is used as a reference clock and the destination clock is the target clock signal. Thus, X=C*D and Y=A*B, in this example.

In a prior system, synchronization may be achieved by dividing a target clock signal by X and the source system clock by Y, comparing the phase of the resulting divided clock signals, and adjusting the phase of the target clock signal. Such a technique may be used in environments using digital or analog phase lock loops (PLLs) as is well known in the relevant arts.

In general, a target clock signal is more accurately synchronized with a reference clock signal if the time between successive comparisons ("comparison cycle period") is small because the shorter periods enable the phase of the target clock signal to be adjusted more frequently. Accordingly, both X and Y may be divided by a common denominator (CD), and the resulting numbers may be respectively used instead of X and Y. The comparison cycles may be shorter proportionate to the CD. In the upscaler embodiment noted above, the number of comparison cycles within a frame equals the common denominator (CD) used to divide (A*B) and (C*D).

However, it may not be possible to make the comparison cycles short in several situations. For example, in the above technique, the greatest common denominator (GCD) of X and Y can be a number as low as 1. Such a situation may be further illustrated with the upscaler of U.S. Pat. No. 5,739,867. If a source image of size 800×600 pixels is to be upscaled to an image of size 1901×1501, only a very low GCD may be present. The upscaled image size may be specified by a user using a suitable user interface. A low GCD may lead to large comparison cycles.

Large comparison cycles may be problematic in several situations. For example, in techniques using PLLs to generate a target clock signal, large synchronization periods may result in large settling times and phase jitter. Phase jitter typically leads to display artifacts. Large settling times may be unacceptable as the tracking and correction abilities of the PLLs may be under-utilized. The problems caused by underutilization depend on the environment in which the PLL is used. For example, a monitor (e.g., using an upscaler according to U.S. Pat. No. 5,739,867) may take unacceptably long time in starting to display an image when a target image size is changed.

Accordingly, what is needed is an effective method and apparatus for synchronizing a target clock signal with a reference clock signal.

SUMMARY OF THE INVENTION

The present invention is directed to a clock generation circuit which generates a target clock signal synchronized with a reference clock signal. The present invention enables the desired comparison cycle period also to be selected by a proper selection of a value L (as described below in detail).

To generate a target clock signal having a frequency of (X/Y) times the frequency of a reference clock signal, two divider sets {E11, E12, E13, ..., E1m} and {E21, E22, E23, ..., E1n}, and corresponding weight elements sets {W11, W12, ..., W1m} and {W21, W22, ..., W2n} are chosen according to the below equations:

$$X/L = (\sigma E1i * W1i)/(\sigma W1i), \text{ for } i=1 \text{ to } m;$$

and $$Y/L = (\sigma E2j * W2j)/(\sigma W2j), \text{ for } j=1 \text{ to } n,$$

wherein '*' represents multiplication.

Instead of using the larger dividers X and Y, the dividers $E1i$ and $E2j$ are used proportional to weights $W1i$ and $W2j$ respectively. By keeping the values $E1i$ close to X/L and $E2j$ close to Y/L, the clock signals generated using the smaller dividers can be used for phase adjustment. The comparison cycle period can be made short by keeping the value of L reasonably large.

The values X/L and Y/L may not equal integers and division by non-integers is generally undesirable because of the required circuit complexity and time. Accordingly, the weight,, $W1i$ and $W2j$ may be chosen such that the divisors are all integers.

In addition, one of X/L or Y/L may be derived as an integer by a proper choice of L. By keeping one of the two values as integers, transient phase errors may be minimized in the target clock signal.

The implementation of division of the non-integer number can also be accomplished using a simple circuit according to an aspect of the present invention. Assuming for illustration that X/L=integer+fraction, integer and (integer+1) may be used as the two divisors, and (1−fraction) and fraction can be used as the respective weights.

At least some of the above aspects have particular application while resizing an image in display units of computer systems. In general, at least to avoid large frame buffers, there may be a need to generate a target clock signal having frequency of ((dst_vtotal*dst_htotal)/(src_vtotal*src_htotal)), wherein the dst_vtotal, dst_htotal, src_vtotal and src_htotal respectively represent the number of lines in a resized image frame, the number pixels in each line of a resized image frame, the number of lines in each source image frame and the number of pixels in each line of the source image frame.

Synchronization may be conveniently attained for either each source line or each resized line by setting L to equal either src_vtotal or dst_vtotal respectively. By setting L to equal dst-vtotal, display artifacts may be present more between lines, as opposed to diagonally. Diagonal artifacts may be present if synchronization is sought to be achieved on a source line basis. Diagonal artifacts are generally undesirable as the resulting image distortions may be readily apparent to the human eye.

Thus, the present invention enables a target clock signal having a frequency of (X/Y) times the frequency of a reference clock signal using small comparison cycles irrespective of the existence of a large common denominator of X and Y, by using multiple smaller dividers, The present invention is particularly suited for display units as clock signals as the display units often generate target clock signals having a frequency different from a reference clock frequence.

The present invention is also suited in conjunction with a scaler as avoidance of large memories may require a sampling clock signal having pre-specified frequency relationship with a reference clock signal.

The present invention minimizes or prevent more visible diagonal artifacts by enabling synchronization on the each line of a resized image, which is displayed on a display unit.

Further features and advantages of the invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is indicated by the leftmost digit(s) in the corresponding reference number.

BRIEF DESCRIPTION OF THE DRAWINGS

The present invention will be described with reference to the accompanying drawings, wherein.

DETAILED DESCRIPTION OF THE PREFERRED EMBODIMENTS

1. Overview and Discussion of the Invention

The present invention is directed to generating a target clock having a frequency of (X/Y) times the frequency of a reference clock signal, wherein X and Y are integers. Specifically, the present invention enables small divisors to be used for division of the reference and target clock signals even if a large common denominator does not exist. Accordingly, the comparison cycles can be maintained to be short. As a result, the target clock signal can track the reference clock signal accurately.

The present invention is described in further detail below. However, it is helpful to first understand an example environment in which the present invention can be implemented.

2. Example Environment

In a broad sense, the invention can be implemented in any system which requires a target clock signal to be synchronized with a reference clock signal. The invention has particular application in the display units of computer systems. Accordingly, the present invention is described in the context of computer systems below.

In general, the present invention can be implemented in any display unit of a computer system. The display units may include both CRT display units and digital display units such as a flat panel monitor. The present invention is described in the context of a computer system operating in graphics modes such as EGA, VGA and SVGA modes. Such computer systems include, without limitation, lap-top and desk-top personal computer systems, work-stations, special purpose computer systems, general purpose computer systems, network computers, and many others. The invention may be implemented in hardware, software, firmware, or combination of the like. The above noted graphics modes are described in detail in a book entitled, "Programmer's Guide to the EGA, VGA, and Super VGA Cards", published by Addition-Wesley Publishing Company, by Richard F. Ferraro, ISBN Number 0-201-62490-7, which is incorporated in its entirety herewith.

Figure 1:
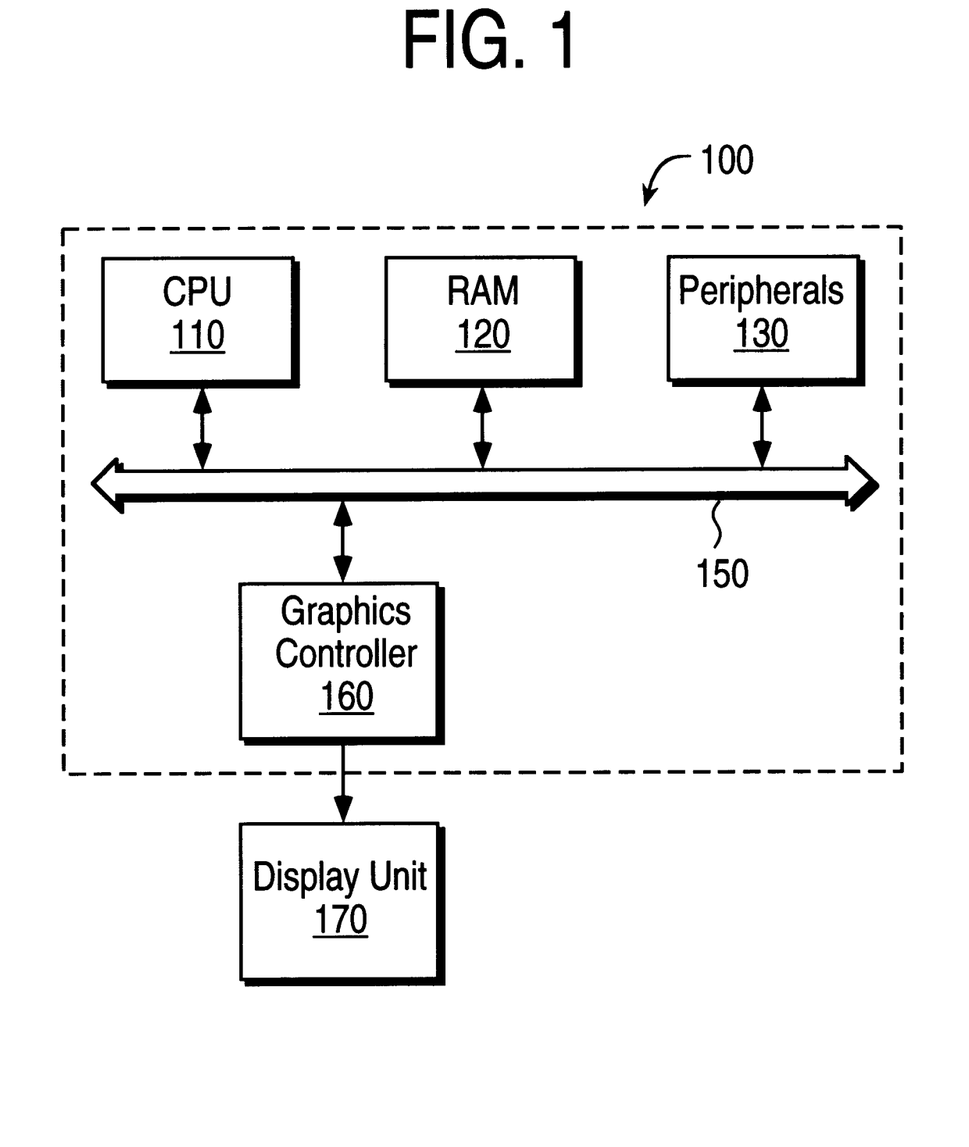
FIG. 1 is a block diagram of a computer system implemented in accordance with the present invention.

FIG. 1 is a block diagram of computer system 100 in which the present invention can be implemented. Computer system 100 includes central processing unit (CPU) 110, random access memory (RAM) 120, one or more peripherals 130, graphics controller 160, and digital display unit 170. CPU 110, RAM 120 and graphics controller 160 are typically packaged in a single unit, and such a unit is referred to as graphics source 199 as an analog display signal is generated by the unit. All the components in graphics source 199 of computer systerm 100 communicate over bus 150, which can in reality include several physical buses connected by appropriate interfaces.

RAM 120 stores data representing commands and possibly pixel data elements representing a source image. CPU 110 executes commands stored in RAM 120, and causes different commands and pixel data to be transferred to graphics controller 160. Peripherals, 130 can include storage components such as hard-drives or removable drives (e.g., floppy-drives). Peripherals 130 can be used to store commands and/or data which enable computer system 100 to operate in accordance with the present invention. By executing the stored commands, CPU 110 provides the electrical and control signals to coordinate and control the operation of various components.

Graphics controller 160 receives data/commands from CPU 110, generates display signals including display data and corresponding synchronization signals, and provides both to digital display unit 170. Computer system 100 is described with reference to graphics controller 160 generating analog display signals, which may be processed by analog or digital display units. However, the present invention may be implemented in conjunction with other types of display signals (e.g., ones implemented for digital display units) as will be apparent to one skilled in the relevant arts, and such other implementations are contemplated to be within the scope and spirit of the present invention.

Graphics controller 160 can generate an analog display signal in the RS-170 standard with RGB signals in one embodiment. In that embodiment, the display signal is in the form of RGB signals and the reference clock signal includes the VSYNC and HSYNC signals well known in the relevant arts. Therefore, three analog display signals (red, green and blue) are generated from each pixel data element. For conciseness, the present invention is described with reference to one display data signal. It should be understood that the description may be applicable to all the three display data signals. It should be further understood that the present invention can be implemented with analog image data and/or reference clock signals in other standards even though the present description is provided with reference to RGB signals. Examples of such standards include composite sync standard usually implemented on Macintosh Computer Systems and digital interface (plug and play) compliant with VESA standards fori flat-panel monitors.

In general, graphics controller 160 first generates pixel data elements of a source image with a predefined width and height (measured in terms of number of pixel data elements). The pixel data elements for a source image may either be provided by CPU 110 or be generated by graphics controller 160 in response to commands from CPU 110. Graphics controller 160 typically includes a digital to analog converter (DAC) for generating an analog display signal based on the pixel data elements in a known way. The DAC is generally driven by a source clock, and the pixel data elements are encoded at the source clock frequency.

Display unit 170 receives a display signal from graphics controller 160, and displays the images encoded in the display signal by processing the received display signal. During such processing, display unit 170 may need to resize the encoded images. Resizing may require a target clock signal to be generated, for example, to avoid using large memories as described in U.S. Pat. No. 5,739,867 entitled, "A Method and Apparatus for Upscaling an Image in Both Vertical and Horizontal Directions", Issued Apr. 14, 1998 to Alexander Eglit. The manner in which an embodiment of display unit 170 may generate such a target clock signal while precessing a received display signal is described below with reference to FIGS. 2 and 3.

3. Method

Figure 2:
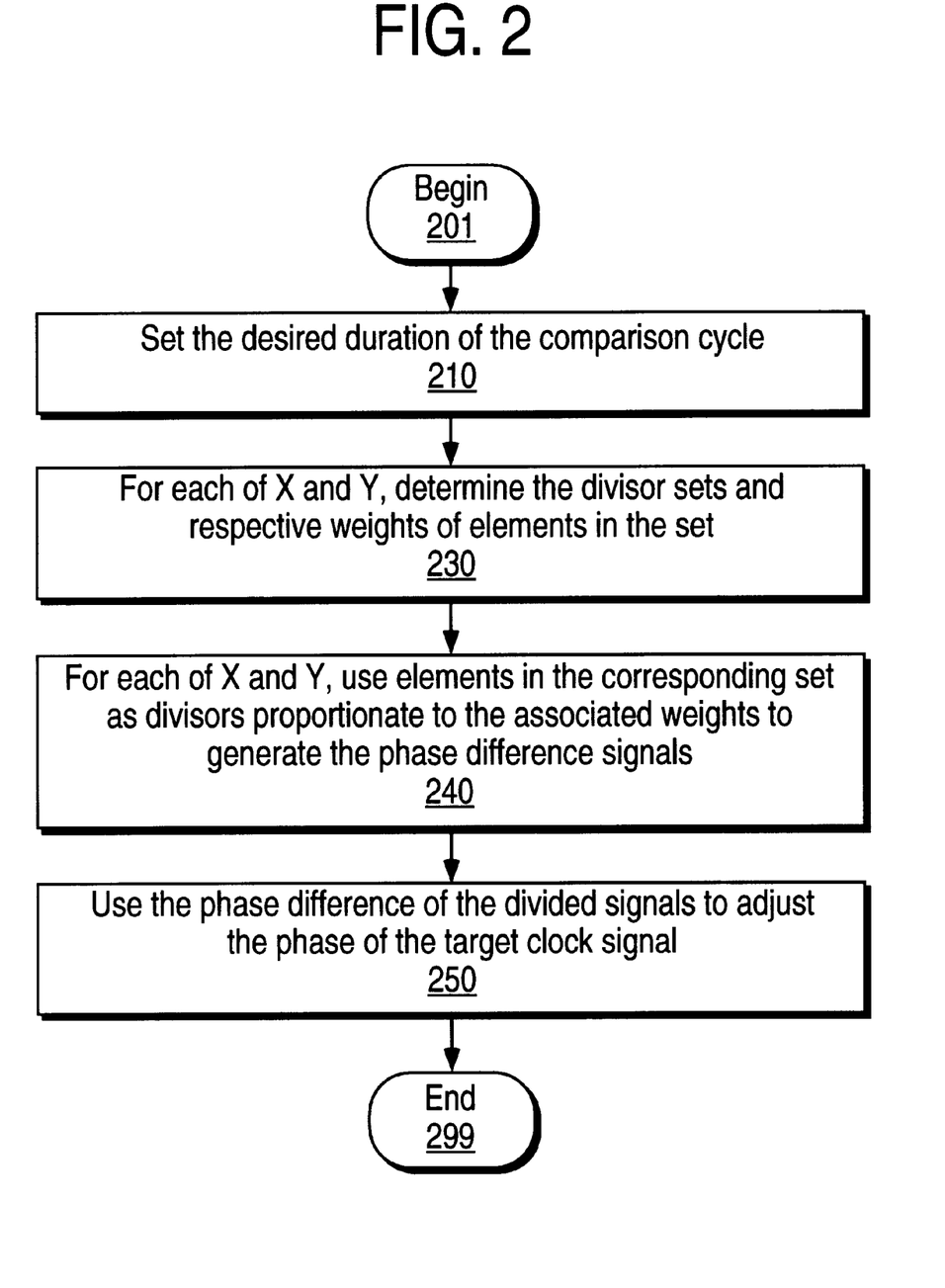
FIG. 2 is a flow-chart illustrating a method according to the present invention.

FIG. 2 is a flow-chart illustrating a method according to the present invention. The method enables a target clock signal having a frequency of X/Y times (X and Y being integers) the frequency of a reference clock signal to be generated in accordance with the present invention. For clarity, the flow-chart is described with reference to display unit 170 of FIG. 1. Each of the steps may be implemented in a combination of hardware, firmware and software as will be apparent to one skilled in the relevant arts.

In step 210, the desired comparison cycle period may be set, for example, by choosing a proper value for a variable L. The manner in which the value of L can be chosen will be clear from the description below. The cycle period generally needs to be computed in terms of the number of clock periods of one of the two clock signals.

In step 230, for each of X and Y, a divisor elements set with one or more divisors and corresponding weights is defined. Assuming a divisor elements set of {E11, E12, E13, . . . , E1$m$} and a weight elements set of {W11, W12, . . . , W1$m$} for X, and a divisor set of {E21, E22, E23, . . . , E1$n$} and a weight elements set of {W21, W22, . . . , W2$n$} for Y, the following relationship may generally need to hold true.

$$X/L=(\sigma E1i*W1i)/(\sigma W1i), \text{ for } i=1 \text{ to } m; \qquad \text{Equation (1)}$$

and $$Y/L=(\sigma E2j*W2j)/(\sigma W2j), \text{ for } j=1 \text{ to } n. \qquad \text{Equation (2)}$$

wherein '*' represents multiplication.

It may be noted that X/L and Y/L need not equal integers, and in several cases the resulting values are non-integers. However, it is generally preferable that at least one of the two values equal integers to minimize implementation complexity and possibly error. That is, L needs to be selected such that Q*L=X or Y, wherein Q is an integer.

When X/L and Y/L are non-integers, each divisor element may be chosen to be an integer to facilitate the division operation. In addition, it may be desirable that each of the divisor elements E1$i$ and E2$j$ be close in value to (X/L) and (Y/L) respectively to minimize the resulting display artifacts. The display artifacts are minimized as the phase jitter may be minimized in the target clock signal.

In step 240, the divisor elements are used as divisors instead of X and Y, and each divisor element is used for a duration proportionate to the corresponding weight. The phase difference of the divided signals may be used for adjusting the phase of the target clock signal. As the divisor elements are close in value to X/L or Y/L, which are smaller than X and Y respectively, the comparison cycles are made short.

Thus, by choosing multiple divisors, the present invention enables small divisors to be used in generating a target clock signal. In turn, the small divisors lead to small comparison cycles, and thereby to better tracking of the target clock signal to the reference clock signal.

The method can be implemented in several embodiments. Some equations, and computations with reference to processing of a display signal in display unit 170 are described first.

4. Computations

Images encoded in display signals received by display unit 170 are characterized by a number of horizontal lines (Src-V Total) and a number of pixels within each horizontal line (Src-Htotal). Each image may need to be resized into an image having Dst-Vtotal lines, with each line having Dst-Htotal points. At least to perform such resizing, a target clock signal having a frequency of Fdclk may need to generated according to the following equations:

$$\text{Src\_Total=Src\_Htotal*Src\_Vtotal} \qquad \text{Equation (3)}$$

$$\text{Dst\_Total=Dst\_Htotal*Dst\_Vtotal} \qquad \text{Equation (4)}$$

The required average Dclk frequency over the frame may needs to be $$\text{Fdclk=Fsclk*(Dst\_Total/Src\_Total)} \qquad \text{Equation (5)}$$

In terms of the description of above $$X=\text{Dst\_Total} \qquad \text{Equation (6)}$$

$$Y=\text{Src\_Total} \qquad \text{Equation (7)}$$

However, target clock signal with a frequency of Fdclk directly, the present invention achieves the effective frequency by using multiple frequencies. Each frequency is achieved by using a different divisor as noted above with reference to FIG. 2.

Further, description is provided below with reference to a specific example. As noted above, it is desirable that X/L or Y/L equal an integer. According, in the illustration herein, it will be assumed that the desired comparison cycle period equals the horizontal line period of the encoded display signal. As a result, the number of the comparison cycles per frame is equal to Src_Vtotal. Thus, $$Src\_Div=Src\_Total/L \quad \text{Equation (8)}$$

$$L=Src\_Vtotal \quad \text{Equation (9)}$$

$$Src\_Div=Src\_Total/Src\_Vtotal=Src\_Htotal \quad \text{Equation (10)}$$

With reference to Equation 2, L equals the number of comparisons desired in a frame, and Src_Div refers to a single divisor element in the divisor elements set. That is, n=1 and W21=1. In other words, a single divisor element can be used in dividing the source clock signal.

As to dividing the target clock signal, here L is the number of comparison cycles per frame. To correspond to the same comparison cycle period, the target clock signal may need to be divided by Dst_Div according to the below equation:

$$Dst\_Div=Dst\_Total/L \quad \text{Equation 11}$$

One problem with this equation is that Dst_div may have a fraction component. It is generally desirable that the divisors contain only integers to simplify implementation of division. Equation (1) may be used to implement the division with multiple divisors as described in further detail below.

Since the Dclk divider is based on the natural numbers, the fractional average divisor may be represented as a combination of two natural divisors:

$$Dst\_Div1=\text{floor }(Dst\_Total/L) \quad \text{Equation 12}$$

wherein 'floor' represents the quotient of the division operation.

$$Dst\_Div2=Dst\_Div1+1 \quad \text{Equation 13}$$

With reference to Equation 1, Dst_Div1 (E11) and Dst_Div2 (E12) represent the two divisor elements with m=2. The weights W11 and W12 may be computed as follows.

The number of cycles with Dst_Div2 over the frame should be $$W12=\text{remainder of }(Dst\_Total/L) \quad \text{Equation 14}$$

$$W11=1-W12 \quad \text{Equation 15}$$

Correspondingly, the number of horizontal source lines L1 and L2 during which Dst_Div1 and Dst_Div2 are used may be computed $$L1=(W11*L)/(W11+W12) \quad \text{Equation 16}$$

$$L2=L-L1=(W12*L)/(W11+W12) \quad \text{Equation 17}$$

Thus, a divider driven by source clock signal may be programmed to divide by Src_Htotal. A divider driven by target clock signal may be programmed to divide by Dst_Div2 for L2 cycles per frame and to divide by the Dst_Div1 for the rest of the frame. The numbers such as L1 and L2 will generally be referred to as Li. The corresponding frequencies for the target clock signal in the steady-state are represented by:

$$Fdclk1=Fsclk*(Dst\_Div1/Src\_Div) \quad \text{Equation 18}$$

$$Fdclk2=Fsclk*(Dst\_Div2/Src\_Div) \quad \text{Equation 19}$$

As noted above, In the proposed scheme, the target clock may be divided by $$Dst\_Div2=Dst\_Div1+1$$

The frequency error, which manifests itself as a systematic phase error in the generated target clock signal can be estimated as follows:

$$dF=Fdclk2-Fdclk1=Fsclk*(Dst\_Div1+1-Dst\_Div1)/Src\_Div \quad \text{Equation 20}$$

$$dF=Fsclk/Src\_Div \quad \text{Equation 21}$$

The equations above show that the systematic error can be made small by appropriate selection of the large Src_Div. However, the comparison cycle length will be increased. In general, a balance needs to be struck between the two considerations.

In one environment, the Src_Htotal is at least 800, the systematic jitter added by such a scheme will be no more than 0.125%, which is generally acceptable in several situations.

The choice of the value of L=Src_Vtotal of above is merely for illustration. In general, the value L is preferably a proper divisor (i.e., having a remainder of zero) of the corresponding total (Src-Total or Dst_total). Thus, L=Src_Htotal is another obvious choice. The comparison frequency will be greater because Vtotal is generally 20 . . . 30% smaller than Htotal. However, the frequency error will also increase. Depending on the display device sensitivity to the frequency shift, different approaches in selecting the value of L can be used.

One problem with the above approach is that the phase adjustment is done asynchronously to the destination line frequency because the comparison cycles, are synchronized with the source lines. Such synchronization generally causes target clock signal frequency shifts during the display of a resized image line with possible visual artifacts. An alternative way described below overcomes at least this problem.

5. Alternative Approach

In the alternative approach, multiple dividers may be used for the source clock signal and a single divider may be used for the target clock signal. Such a clock signal generation scheme effectively modulate the reference to the Dclk loop causing the frequency swing synchronous with the destination lines; such a frequency shift will happen during the horizontal retrace on the DST side.

The revised set of equations may be derived exactly as before, swapping the parameters for the source and target clock signals. Some representative equations are provided below.

$$L=Dst\_Vtotal \quad \text{Equation 22}$$

$$Dst\_div=Dst\_Total/L=Dst\_Htotal \quad \text{Equation 23}$$

$$Src\_Div1=Src\_Total/L=Src\_Total/Dst\_Vtotal \quad \text{Equation 24}$$

$$Src\_Div2=Src\_Div1+1 \quad \text{Equation 25}$$

$$L2=\text{Remainder of }(Src\_Total/Dst\_Vtotal) \quad \text{Equation 26}$$

$$dF=Fsclk*Dst\_div*((1/Src\_Div1)-(1/Src\_Div1+1)) \quad \text{Equation 27}$$

$$dF=Fsclk*(Dst\_div/Src\_Div1)*(1-Src\_div1/(Src-divl+1)) \quad \text{Equation 28}$$

The more complex equation (compared to synchronization based on each horizontal line of a source each) for the frequency error comes from the fact that the error with respect to stable reference clock while swinging the Dclk running with the fixed divisor. Otherwise, the error may be roughly estimated as $$dF = Fdclk/Dst\_div \qquad \text{Equation 29}$$

Note, however, the Fdclk is not constant. The average Fdclk may be used here instead of the actual Fdclk1 or Fdclk2, particularly when the divisor elements are chosen to be close numbers. As may be apparent to one skilled in the relevant arts, the revised scheme reduces the diagonal non-uniform artifacts which are arguably more disturbing for the human eye than artifacts caused by the horizontal line to line deviations.

Several embodiments of display unit 170 may be implemented using the present invention. Some example embodiments are described below in detail.

6. Display Unit

Figure 3:
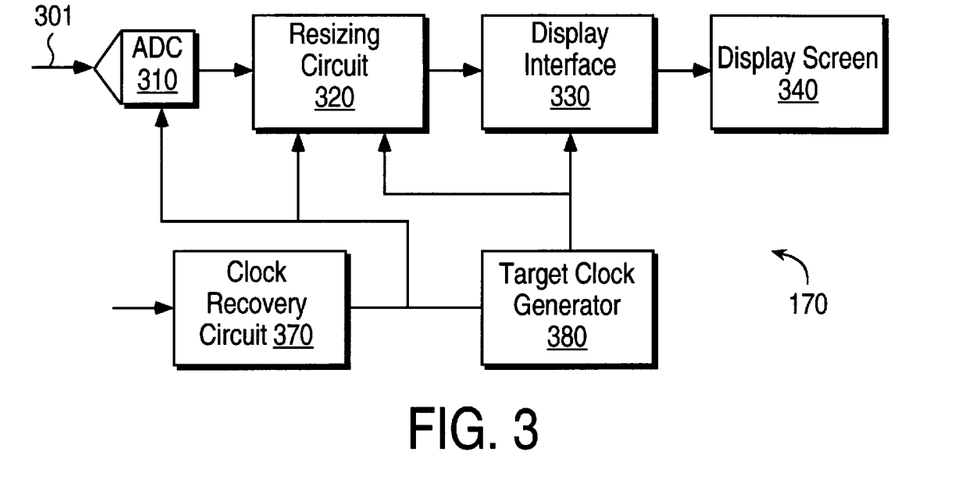
FIG. 3 is a block diagram of a display unit implemented in accordance with the present invention.

The details of an embodiment of display unit 170 are depicted in FIG. 3. Display unit 170 may include analog to digital converter (ADC) 310, resizing circuit 320, display interface 330, display screen 340, clock recovery circuit 370, and target clock generator 380. Each block is described below in further detail.

ADC 310 samples the display data received on line 301 under the control of sampling clock provided on line 378. For illustration, an image of size Src_Vtotal×Src_Htotal pixels may be assumed to be generated, wherein Src_Vtotal and Src_Htotal respectively represent the number of lines in a frame and the number of pixel in each line of the frame. The sampled pixel data elements are provided to resizing circuit 320.

Clock recovery circuit 370 receives on line 307 the synchronization signals contained in the received display signal, and generates a sampling clock synchronized with the synchronization signals. An embodiment of clock recovery circuit is described in detail in U.S. Pat. No. 5,796,392, entitled, "A Method and Apparatus for Clock Recovery in a Digital Display Unit", naming as inventor Alexander J. Eglit, and is incorporated in its entirety into the present application. The generated clock signal is provided oil the REFERENCE CLOCK line 378.

Resizing circuit 320 receives a target clock signal on line 382 and resizes the image frames provided by ADC 310. Resizing circuit 320 may perform resizing operations as may be specified by a user, and provide the resulting pixel data elements to display interface 330, which generates the display signals to display screen 340 to cause the resized images to be generated.

To perform resizing operations, resizing circuit 320 may include large memories (termed frame buffers). Large memories may be undesirable at least due to the additional costs arid the space which may be occupied. Accordingly, an embodiment of resizing circuit 320, which can resize a source image (of size Src_Vtotal×Src_Htotal) to a destination image (of size Dst_Vtotal×Dst_Htotal) without using excessive memory is described in U.S. Pat. No. 5,739,867 entitled, "A Method and Apparatus for Upscaling an Image in Both Vertical and Horizontal Directions", Issued Apr. 14, 1998, naming as inventor Alexander Julian Eglit.

For the embodiment to resize the images as desired, the target clock signal may need to have a frequency of((Dst_Vtotal*Dst_Htotal)/(Src_Vtotal*Src_Htotal)) times the frequency of SRC-clock signal generated on line 378. Target clock generator 380 receives the sampling clock signal as a reference clock signal and generates a target clock signal in accordance: with the present invention. The manner in which target clock generator 380 may generate the target clock signal in example embodiments is described below with reference to FIGS. 4A and 4B.

7. Target Clock Generator

Figure 4A:
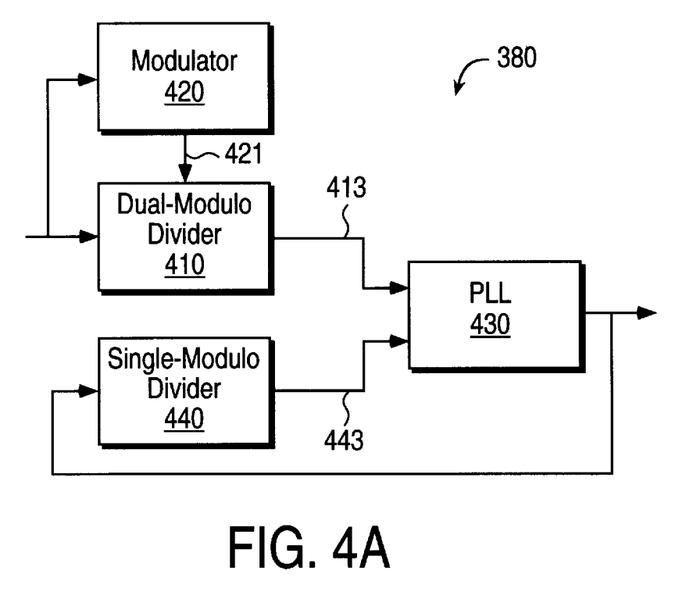
FIG. 4A is a block diagram of an embodiment of a target clock generator implemented in accordance with the present invention.

FIG. 4A is a block diagram illustrating the details of an example embodiment of target clock generator 380 in accordance with the present invention. The embodiment uses multiple divisors for dividing the reference clock to avoid diagonally non-uniform artifacts. As noted above, using multiple divisors for dividing the target clock signal (while using a single divider for dividing the reference clock signal) may lead to diagonally non-uniform artifacts, and may be thus undesirable. In addition, for simplicity of implementation, target clock generator 380 is shown using only two divisors.

Modulator 420 generates an output on line 421 indicating which of the potential divisors need to be used for dividing the reference clock signal received on line 378. As noted above, aggregate usage of each divider needs to be proportional to the associated weight. In the case when only two divisors are used, line 378 may carry a binary value.

While maintaining the aggregate frequency of usage of divisors, the usage of divisors can be according to several schemes. For example, each weight may be used consecutively (Li times) to correspond to the associated weight as illustrated with reference to FIG. 5A.

Figure 5A:
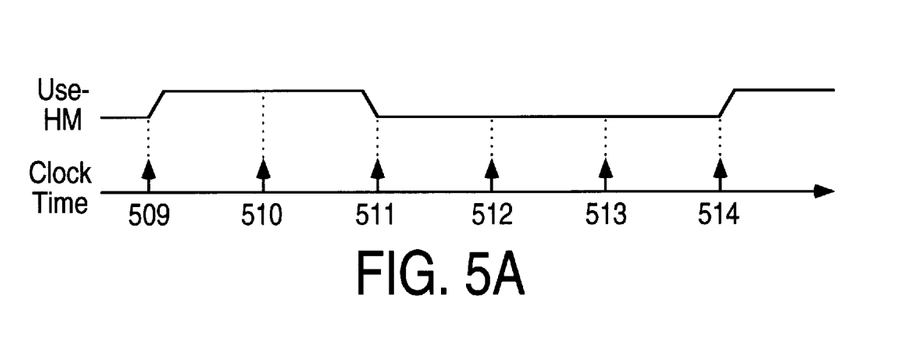
FIG. 5A is a timing diagram illustrating one approach of using multiple divisors while generating a target clock signal in accordance with the present invention.

In FIG. 5A, first and second divisors are assumed to have associated weights of 2/5 and 3/5 respectively. The first divisor is shown being used for the first two comparison cycles (between 509 and 511) corresponding to a high value on the USE-HM (use high modulo) signal, while the second divisor is shown being used for the later three comparison cycles (513) corresponding to a low value on the USE-HM signal. Even though not illustrated in the Figure, the five comparison cycles may have slightly different comparison cycle durations as noted above with respect to error analysis.

Figure 5B:
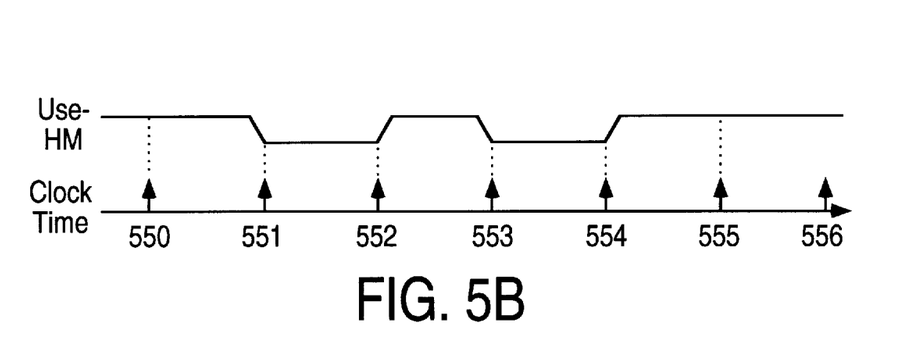
FIG. 5B is a timing diagram illustrating another approach of using multiple divisors while generating a target clock signal in accordance with the present invention.

In the alternative, the first and second divisors may be interspersed as illustrated with reference to FIG. 5B. Thus, the first divider is shown being used in comparison cycles represented between time points 550 to 551, 552 to 553, and 554 to 556 (corresponding to a high value on USE-HM signal). The second divider is shown being used in comparison cycles represented between time points 551 to 552 and 553 to 554.

In general, the approach of FIG. 5A may lead to images having display artifacts in which one portion of the image is shifted relative to the other. However, the amount of shift may be acceptable. In contrast, the approach of FIG. 5B may have interleaved lines with small shifts. However, the approach of FIG. 5A may be simpler to implement and according an example embodiment implementing the approach of FIG. 5A is described below.

Continuing with reference to FIG. 4A, divider 410 divides the source clock signal by the divisor indicated by modulator 420 to generate a divided clock signal. In case only two divisors are used, the divider may be implemented as a dual-modulo divider 410 as shown in FIG. 4A. Assuming that synchronization is sought to be achieved for each horizontal line in the resized image frame, a divider to divide the target clock signal may be implemented as s,ingle modulo divider 440.

Phase lock loop (PLL) 430 adjusts the phase of the target clock signal according to the difference of the phases of the divided signals received on lines 413 and 443. Divider 410 and PLL 430 can be implemented in a known way. PLL 430 may comprise a digital or analog phase lock loop.

Thus, clock generator circuit 380 may generate a target signal having an average frequency of (X/Y) times the frequency of a source clock signal. The circuit of FIG. 4A can be optimized in several ways. An example optimization is illustrated with reference to FIG. 4B.

8. Alternative Embodiments of Target Clock Generator

Figure 4B:
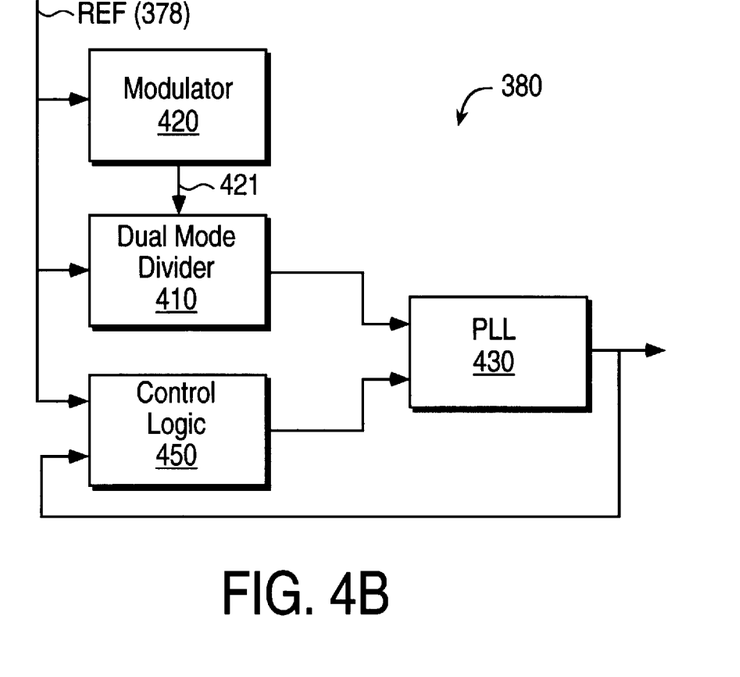
FIG. 4B is a block diagram of an alternative embodiment of a target clock generator implemented in accordance with the present invention.

FIG. 4B is a block diagram illustrating an alternate embodiment of target clock generator 380. Only the differences from FIG. 4A are described for conciseness. Divider 440 is shown replaced by control logic 450. Control logic 450 is usually provided as a part of the circuitry which drives display screen 340. Control logic 450 is generally implemented to provide a DST_HSYNC signal, which indicates the end of a resized horizontal line. Therefore, such a DST_HSYNC signal can be used instead of divider 440. Thus, target clock generator 380 of FIG. 4B can also be used to generate a target clock signal in accordance with the present invention.

Even though the embodiments of above are described as using a single divisor for the target clock signal and multiple divisors (if needed) for the reference clock signal, it should be understood that the present invention can be implemented using a single divisor for the reference clock signal and multiple divisors for the target clock signal as illustrated with reference to FIG. 4C.

Figure 4C:
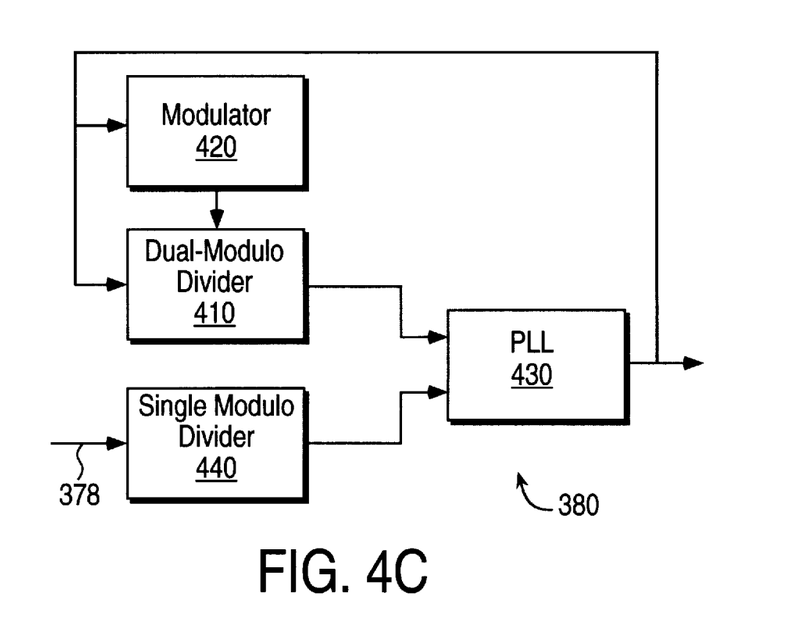
FIG. 4C is a block diagram of yet another embodiment of a target clock generator implemented in accordance with the present invention.

FIG. 4C is a block diagram illustrating the details of yet another embodiment of target clock generator 380. In the embodiment, divider 460 is driven by modulator 420 and the target clock signal generated by PLL 430. Divider 470 is driven by the reference clock signal received on line 378. Modulator 420 here may be driven by Dst_Htotal or Dst_Vtotal as appropriate.

Figure 4D:
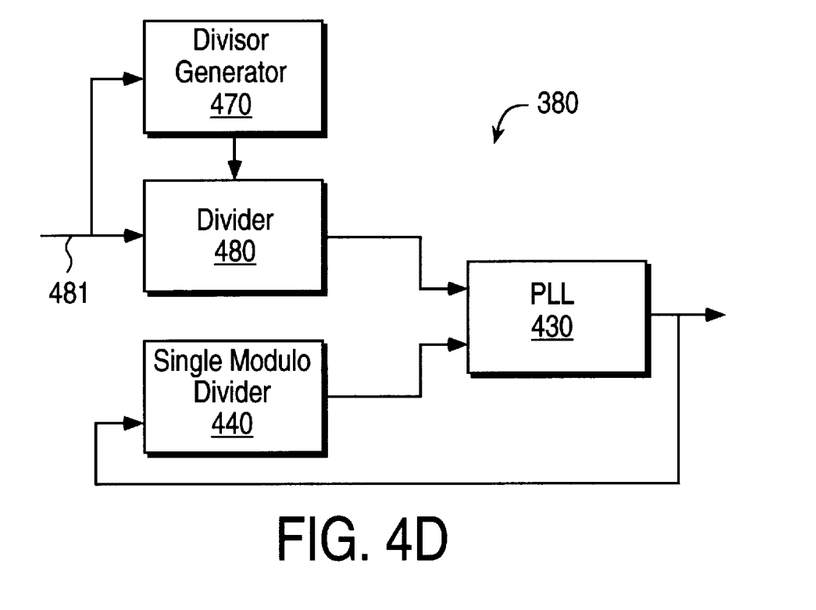
FIG. 4D is a block diagram illustrating the details of an alternative embodiment of a target clock generator.

Even though the embodiments of FIGS. 4A–4C are implemented using only two dividers, it should be further understood that the present invention can be implemented using multiple dividers as illustrated with reference to FIG. 4D. In comparison to FIG. 4A, modulator 420 and dual modulo divider 410 are together shown replaced by divisor generator 470 and divider 480. The remaining components are described above and the description is not repeated for conciseness.

Divisor generator 470 may generate the divisors according to the desired frequency. Divider 480 may be implemented to divide using the generated divisors. That is, divider 480 may divide the clock signal received on line 481 by a divisor until a new divisor is provided by divisor generator 470. The implementation of divisor generator 470 and divider 480 will be apparent to one skilled in the relevant arts.

The first combination of modulator 420 and dual-modulo divider 410, and the second combination of divisor generator 470 and divider 480 are examples of circuits which divide the corresponding clock signal by multiple dividers according to the corresponding weight. The combination circuits may be referred to as frequency-divider circuits in the present application.

Thus, several embodiments of target clock generator 380 may be implemented in accordance with the present invention. The description is continued with example embodiments of dual-modulo divider 410 and modulator 420.

9. Dual-modulo Divider

Figure 6:
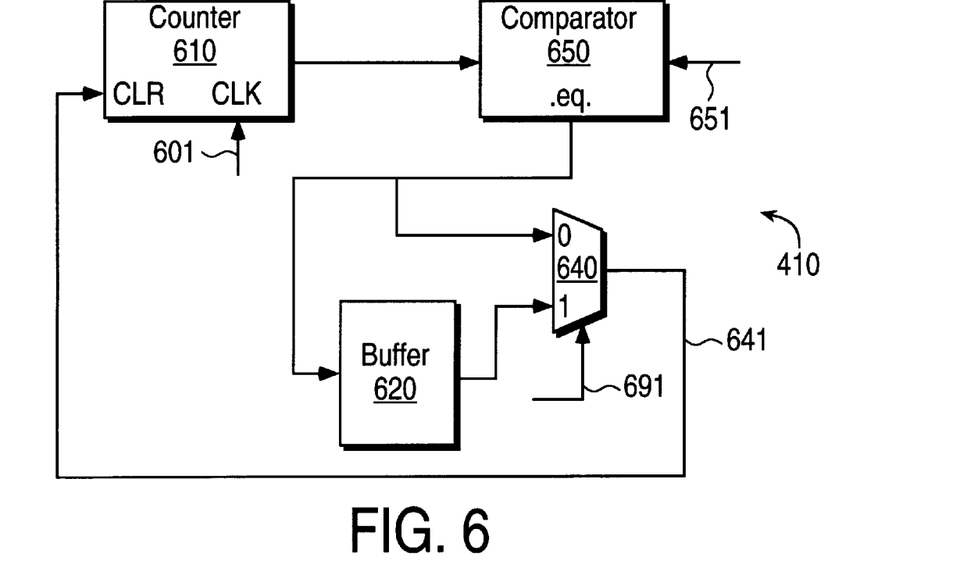
FIG. 6 is a block diagram illustrating the details of a dual-module-divider in one embodiment.

FIG. 6 is a block diagram illustrating the details of an embodiment of dual-modulo divider 410. As noted above, dual-modulo divider 410 operates to provide one of the two dividers. The two dividers can be consecutive integers as noted in Equations 12 and 13 above. Dual modulo divider 410 generates each divider according to the desired frequency. It may be noted that the sequence of divider generation is as in FIG. 5A.

Counter 610 counts the number of pulses (ticks) on line 601 and is reset by the signal on line 641. Line 601 may represent either the source clock or the target clock signal depending on the embodiment used. As described below, counter 610 is designed to count from 0 to (lower divisor−2) or to (lower divisor).

Equality comparator 650 compares the lower value of the two divisors−1(e.g., Src_div1−1 in the Equation 25) received on line 51 and the value stored in counter 610. A value of 1 is generated on line 654 when equality is detected, and 0 is generated otherwise. Buffer 620 operates to delay the output of comparator 650 by one clock cycle to correspond to the higher value of the two divisors−1. Multiplexor 640 selects either buffer 620 output or comparator 650 output under the control of line 691. Line 691 may correspond to line 421.

It should be understood that the implementation of above of above is described for the case when the two divisors differ in value by 1. Extension of the implementation or other implementations to cover when the divisors differ in values greater than 1 or when there are multiple divisors will be apparent to one skilled in the relevant arts. Such extensions and implementations are contemplated to be within the scope and spirit of the present invention. For example, multiple stage buffers may be implemented to achieve different levels of delays and taps at intermediate stages may be taken to correspond to different weights.

Thus, it should be appreciated that a value of 1 is generated on line 641 with a period of either Src_div1 or Src_Div+1, with the period being controlled by the values on line 691. The value on line 691 may controlled by modulator 420. An embodiment of modulator 420, which generates values as in FIG. 5A is described below.

10. Modulator

Figure 7:
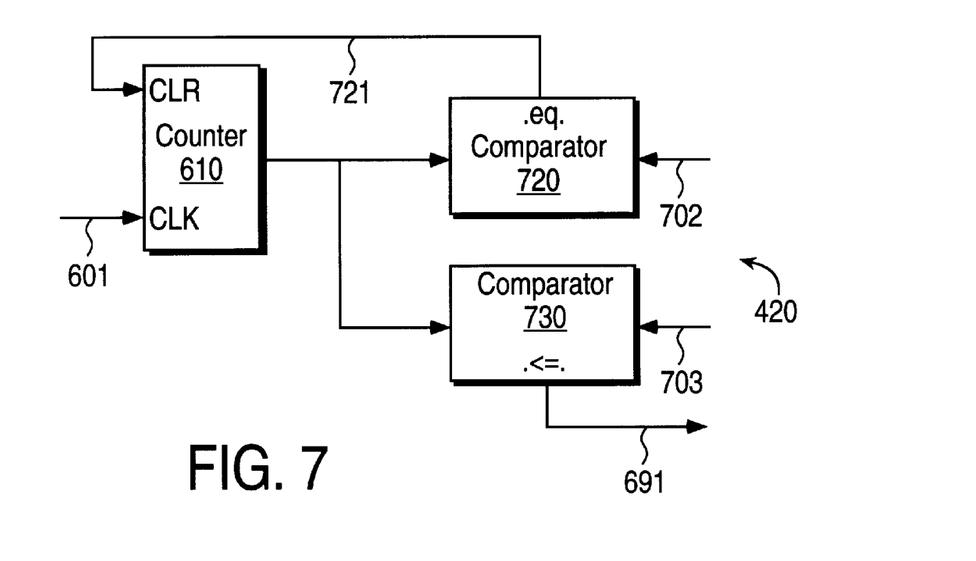
FIG. 7 is a block diagram illustrating the details of a modulator in one embodiment.

FIG. 7 is a block diagram illustrating the details of an embodiment of modulator 420. Equality comparator 720 compares the value L received on line 702 and resets counter 710 once every L clock cycles. As noted above, L determines the comparison cycle period.

Less than or equal to comparator 730 receives a weight (represented by L2−1) on line 703 and generates a 1 on line 691 when the value in counter 710 is less than the weight. Thus, a value of 1 is generated when the counter is less than or equal to L2−1, and a 0 otherwise. From this description, it should be clear that a value of 1 is generated for L2 lines and a value of 0 is generated for the remaining lines.

Accordingly, a first divisor is used by divider 410 for L2 lines and a second divider is used for the remaining lines. By using the multiple dividers according to the associated weights, the present invention generates a target clock signal having an average desired frequency, but with shorter comparison cycles.

11. Conclusion

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A method of generating a target clock signal having a frequency of (X/Y) times the frequency of a reference clock signal, said method comprising the steps of:

(a) selecting the desired approximate duration of a comparison cycle period;

(b) determining a divisors set of {E11, E12, E13, ..., E1$m$} and a weight elements set of {W11, W12, ..., W1$m$} for X, wherein $X/L = ((E1i * W1i)/(W1i))$, for $i=1$ to $m$, wherein '*' represents multiplication, wherein L is a number determining said desired duration of comparison period, and wherein i, L and m are integers;

(c) determining a divisors set of {E21, E22, E23, ..., E1n} and a weight elements set of {W21, W22, ..., W2n}, wherein $Y/L = ((E2j * W2j)/(W2j))$, for $j=1$ to $n$, wherein at least one of said divisor sets contains a plurality of divisors, wherein j and n are integers, and * represents multiplication operation;

(d) dividing said reference clock signal at a present comparison cycle by each of said divisor elements E2j, wherein each of said divisor elements E2j is used proportionate to the associated weight W2j;

(e) dividing said target clock signal at said present comparison cycle by each of said divisor elements E1i, wherein each of said divisor elements E1i is used proportionate to the associated weigh E1i; and (f) generating a phase difference of said divided clock signals generated in (d) and (e), and adjusting the phase of said target clock signal by using said phase difference, wherein said target clock signal for a future comparison cycle is generated by the adjusting performed using said phase difference in step (f), and wherein said target clock signal is generated by iteratively performing steps (d), (e) and (f), wherein said target clock signal of a future comparison cycle generated in one iteration is used as said target clock signal for a present comparison cycle for a subsequent iteration.

2. The method of claim 1, wherein said method is implemented in a display unit of a computer system, said method comprising the further steps of:

(g) receiving a display signal containing source image frames;

(h) resizing each of said source image frames to a resized image frame using said target clock signal; and (i) displaying said resized image frames on a display unit.

3. The method of claim 2, wherein each of said source image frames has a size of Src_Vtotal×Src_Htotal, wherein Src_Vtotal represents the number of lines in each image frame and Src_Htotal represents the number of pixels in each line, and each resized image frame has a size of Dst_Vtotal×Dst_Htotal, wherein Dst_Vtotal represents the number of lines in each resized image frame and Dst_Htotal represents the number of pixels in each line of said resized image frame, said method comprising the further steps of:

(j) setting Y=Src_Vtotal*Src_Htotal; and (k) setting X=Dst_Vtotal*Dst_Htotal, such that said resizing operation can be performed without requiring large buffer.

4. The method of claim 3, wherein steps (a) and (b) comprise selecting L such that L*Q=X or Y such that at least a first one of said divisor sets may contain a single divisor, wherein Q is an integer.

5. The method of claim 4, wherein L is set equal to Dst_Htotal such that the adjustment of step (f) is performed for each horizontal line of said resized frames.

6. The method of claim 4, wherein L is set equal to Src_Htotal such that the adjustment of step (f) is performed for each horizontal line of the image frame encoded in said display signal.

7. The method of claim 4, wherein either X/L or Y/L equals an integer+fraction, and wherein the corresponding divisor set is designed to contain only two divisors.

8. The method of claim 7, further comprising the steps of:

(l) setting a first one of said two divisors to equal said integer;

(m) setting a second one of said two divisors to equal said integer+1;

(n) setting a weight associated with said second one of said two divisors to equal said fraction; and (o) setting a weight associated with said first one of said two divisors to equal (1−fraction).

9. The method of claim 4, wherein at least one of said divisor sets contain multiple divisors.

10. The method of claim 1, wherein each of steps (d) and (e) comprise the step of using divisor elements in an interleaved fashion according to the frequency determined by the weights.

11. The method of claim 1, wherein each of steps (d) and (e) comprise the step of using each divisor element successively according to the frequency determined by the respective weight.

12. A display unit for use in a computer system, said display unit generating a target clock signal having a frequency of (X/Y) times the frequency of a reference clock signal, said display unit comprising:

means for selecting the desired approximate duration of a comparison cycle period;

means for determining a divisors set of {E11, E12, E13, ..., E1m} and a weight elements set of {W11, W12, ..., W1m} for X, wherein $X/L = ((E1i * W1i)/(W1i))$, for $i=1$ to $m$, wherein '*' represents multiplication, wherein L is a number determining said desired duration of comparison period, and wherein i, L and m are integers;

means for determining a divisors set of {E21, E22, E23, ..., E1n} and a weight elements set of {W21, W22, ..., W2n}, wherein $Y/L = ((E2j * W2j)/(W2j))$, for $j=1$ to $n$, wherein at least one of said divisor sets contains a plurality of divisors, wherein j and n are integers, and * represents multiplication operation;

means for generating a first divided clock signal by dividing said reference clock signal by each of said divisor elements E2j, wherein each of said divisor elements E2j is used proportionate to the associated weight W2j;

means for generating a second divided clock signal by dividing said target clock signal of a present comparison cycle by each of said divisor elements E1i, wherein each of said divisor elements E1i is used proportionate to the associated weigh E1i;

means for generating a phase difference of said first divided clock signal and said second divided clock signal; and means for adjusting the phase of said target clock signal by using said phase difference to generate a target clock signal for a future comparison cycle, wherein said target clock signal is generated by iteratively generating said phase difference and performing said adjusting, wherein said target clock signal of a future comparison cycle generated in one iteration is used as said target clock signal of a present comparison cycle for a subsequent iteration.

13. The display unit of claim 12, further comprising:

means for receiving a display signal containing source image frames;

means for resizing each of said source image frames to a resized image frame using said target clock signal; and means for displaying said resized image frames on a display unit.

14. The display unit of claim 13, wherein each of said source image frames has a size of Src_Vtotal×Src_Htotal, wherein Src_Vtotal represents the number of lines in each image frame and Src_Htotal represents the number of pixels in each line, and each resized image frame has a size of Dst_Vtotal×Dst_Htotal, wherein Dst_Vtotal represents the number of lines in each resized image frame and Dst_Htotal represents the number of pixels in each line of said resized image frame, said display unit further comprising:

means for setting Y=Src_Vtotal*Src_Htotal; and means for setting X=Dst_Vtotal*Dst_Htotal, such that said resizing operation can be performed without requiring large buffer.

15. A display circuit for use in a computer system, said display circuit including a clock generator circuit for generating a target clock signal having a frequency of (X/Y) times the frequency of a reference clock signal, said clock generator circuit comprising:

first means for determining a divisors set of {E11, E12, E13, . . . , E1$m$} and a weight elements set of {W11, W12, . . . , W1$m$} for X, wherein $X/L=((E1i*W1i)/(W1i))$, for $i$=1 to $m$, wherein '*' represents multiplication, wherein L is a number determining a desired duration of comparison period, and wherein i, L and m are integers;

second means for determining a divisors set of {E21, E22, E23, . . . , E1$n$} and a weight elements set of {W21, W22, . . . , W2$n$}, wherein $Y/L=((E2j*W2j)/(W2j))$, for $j$=1 to $n$, wherein at least one of said divisor sets contains a plurality of divisors, wherein j and n are integers, and * represents multiplication operation;

a first frequency divider for generating a first divided clock signal by dividing, said reference clock signal by each of said divisor elements E2$j$, wherein each of said divisor elements E2$j$ is used proportionate to the associated weight W2$j$;

a second frequency divider for generating a second divided clock signal by dividing said target clock signal of a present comparison cycle by each of said divisor elements E1$i$, wherein each of said divisor elements E1$i$ is used proportionate to the associated weigh E1$i$; and a phase lock loop (PLL) for adjusting the phase of said target clock signal by using the phase difference of said first divided clock signal and said second divided clock signal to generate a target clock signal for a future comparison cycle, wherein said target clock signal is generated by iteratively generating said phase difference and performing said adjusting, wherein said target clock signal of a future comparison cycle generated in one iteration is used as said target clock signal of a present comparison cycle for a subsequent iteration.

16. The display circuit of claim 15, wherein said display circuit is implemented in a display unit, said display circuit further comprising:

an analog to digital converter (ADC) for receiving a display signal and generating a plurality of pixel data elements representing a source image frame contained in said ADC;

a resizing circuit for resizing said source image frame to generate a resized image frame using said target clock signal; and a panel interface for displaying said resized image frames on a display screen contained in said display unit.

17. The display circuit of claim 16, wherein said source image frame has a size of Src_Vtotal×Src_Htotal, wherein Src_Vtotal represents the number of lines in each image frame and Src_Htotal represents the number of pixels in each line, and said resized image frame has a size of Dst_Vtotal×Dst_Htotal, wherein Dst_Vtotal represents the number of lines in each resized image frame and Dst_Htotal represents the number of pixels in each line of said resized image frame, wherein Y is set equal to Src_Vtotal*Src_Htotal and X is set equal to Dst_Vtotal*Dst_Htotal, such that said resizing operation can be performed without requiring a large buffer.

18. The display circuit of claim 17, wherein at least one of said first frequency divider and said second frequency divider comprise:

a dual modulo divider for dividing the corresponding clock signal by one of two divisors; and a modulator for generating a binary value indicative of which of the two divisors is to be used by said dual module divider, wherein said binary value is representative of which of said two divisors is to be used by said dual modulo divider.

19. The display circuit of claim 18, wherein said two dividers are consecutive integers.

20. The display circuit of claim 17, wherein at least one of said first frequency divider and said second frequency divider comprise:

a divider generator for generating each divisor element in a corresponding divisor elements set at a frequency determined by the corresponding weights; and a divider for dividing a corresponding clock signal by the divider generated by said divider generator.

* * * * *